United States Patent
Leahey et al.

(10) Patent No.: US 9,914,994 B2
(45) Date of Patent: Mar. 13, 2018

(54) SYSTEM ARCHITECTURE FOR COMBINED STATIC AND PASS-BY PROCESSING

(71) Applicant: Intevac, Inc., Santa Clara, CA (US)

(72) Inventors: Patrick Leahey, San Jose, CA (US); Eric Lawson, Sunnyvale, CA (US); Charles Liu, Los Altos, CA (US); Terry Bluck, Santa Clara, CA (US); Kevin P. Fairbairn, Los Gatos, CA (US); Robert L. Ruck, San Jose, CA (US); Samuel D. Harkness, IV, Berkeley, CA (US)

(73) Assignee: INTEVAC, INC., Santa Clara, CA (US)

( * ) Notice: Subject to any disclaimer, the term of this patent is extended or adjusted under 35 U.S.C. 154(b) by 820 days.

(21) Appl. No.: 13/728,145

(22) Filed: Dec. 27, 2012

(65) Prior Publication Data
US 2013/0161183 A1    Jun. 27, 2013

Related U.S. Application Data

(60) Provisional application No. 61/580,642, filed on Dec. 27, 2011.

(51) Int. Cl.
*C23C 14/34* (2006.01)
*C23C 14/50* (2006.01)
*C23C 14/56* (2006.01)

(52) U.S. Cl.
CPC .............. *C23C 14/34* (2013.01); *C23C 14/50* (2013.01); *C23C 14/566* (2013.01); *C23C 14/568* (2013.01)

(58) Field of Classification Search
CPC ......... H01L 21/67742; H01L 21/67748; H01L 21/68707; C23C 14/34; C23C 14/50; C23C 14/566; C23C 14/568
(Continued)

(56) References Cited

U.S. PATENT DOCUMENTS

| 4,500,407 A | 2/1985 | Boys et al. |
| 5,215,420 A * | 6/1993 | Hughes ............... G11B 5/8404 118/719 |

(Continued)

FOREIGN PATENT DOCUMENTS

| CN | 1455951 A | 11/2003 |
| CN | 1755525 A | 4/2006 |

(Continued)

OTHER PUBLICATIONS

International Preliminary Report on Patentability in PCT Application No. PCT/US2012/071684, dated Jul. 10, 2014.
(Continued)

*Primary Examiner* — John J Brayton
(74) *Attorney, Agent, or Firm* — Womble Bond Dickinson (US) LLP; Joseph Bach, Esq.

(57) ABSTRACT

Disclosed is a substrate processing system which enables combined static and pass-by processing. Also, a system architecture is provided, which reduces footprint size. The system is constructed such that the substrates are processed therein vertically, and each chamber has a processing source attached to one sidewall thereof, wherein the other sidewall backs to a complementary processing chamber. The chamber system can be milled from a single block of metal, e.g., aluminum, wherein the block is milled from both sides, such that a wall remains and separates each two complementary processing chambers.

15 Claims, 9 Drawing Sheets

(58) Field of Classification Search
USPC .................................... 414/935, 939, 941
See application file for complete search history.

(56) References Cited

U.S. PATENT DOCUMENTS

| | | | | |
|---|---|---|---|---|
| 5,339,128 | A * | 8/1994 | Tateyama | ............... B29C 31/00 396/604 |
| 5,340,454 | A * | 8/1994 | Schaefer | ............... C23C 14/568 204/192.12 |
| 5,538,610 | A * | 7/1996 | Gesche | ............... C23C 14/022 204/298.15 |
| 5,683,561 | A | 11/1997 | Hollars et al. | |
| 5,846,328 | A * | 12/1998 | Aruga | ............... C23C 14/568 118/718 |
| 6,517,692 | B1 * | 2/2003 | Zeberinsh | ............ C23C 14/568 118/500 |
| 6,919,001 | B2 | 7/2005 | Fairbairn et al. | |
| 2003/0159919 | A1 * | 8/2003 | Fairbairn | ............ C23C 14/568 204/192.2 |
| 2009/0182454 | A1 * | 7/2009 | Donoso | ............... B25J 9/1692 700/254 |
| 2010/0006420 | A1 * | 1/2010 | Greenberg | ............ C23C 14/541 204/192.12 |
| 2010/0024731 | A1 | 2/2010 | Eristoff et al. | |
| 2010/0055296 | A1 * | 3/2010 | Bankmann | ............ C23C 14/56 427/8 |
| 2011/0104847 | A1 | 5/2011 | Bluck et al. | |

FOREIGN PATENT DOCUMENTS

| | | |
|---|---|---|
| CN | 104471697 A | 3/2015 |
| JP | 2015-504248 | 2/2015 |
| TW | 201335413 A | 9/2013 |
| TW | I499685 B | 9/2015 |
| WO | 2006/026886 A1 | 3/2006 |
| WO | 2013/101851 A1 | 7/2013 |

OTHER PUBLICATIONS

Written Opinion in Singapore Patent Application No. 11201403609Q dated Mar. 24, 2015.
Office Action for Taiwanese Patent Application No. 101150401 dated Aug. 20, 2014.
International Search Report for PCT/US2012/071684 dated Feb. 25, 2013.
Notice of Allowance in Taiwanese Patent Application No. 101150401 dated May 29, 2015.
First Office Action for Chinese Patent Application No. 201280070679.0 dated May 4, 2016.
Examination Report for Singapore Patent Application No. 11201403609Q dated Apr. 18, 2016.
Written Opinion in Singapore Patent Application No. 11201403609Q dated Sep. 29, 2015.

* cited by examiner

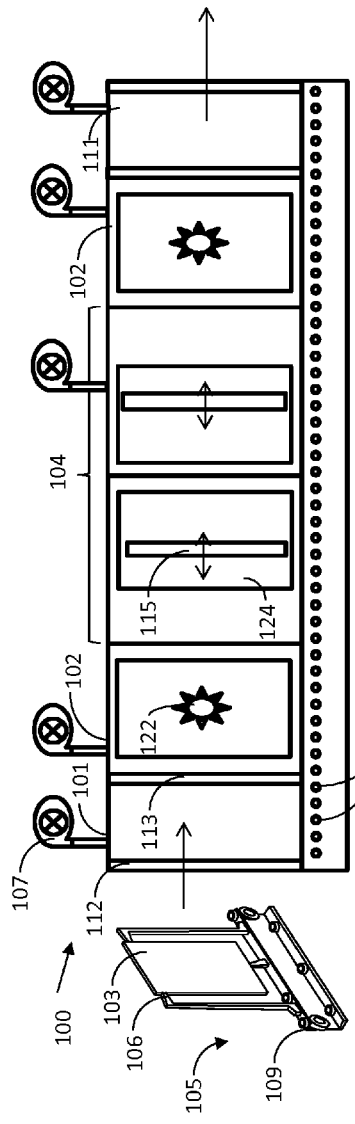
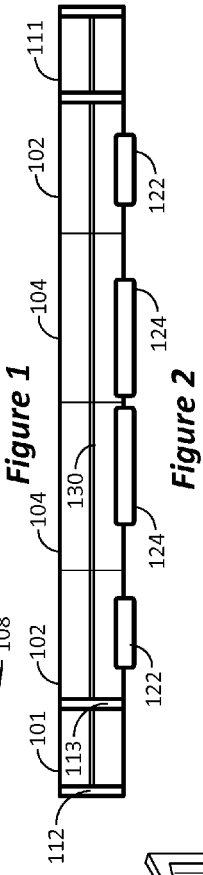
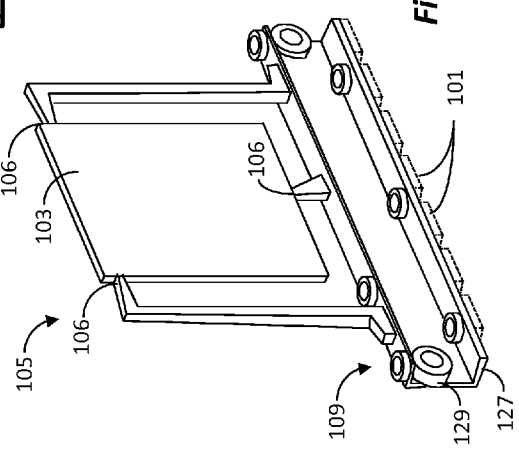
Figure 1
Figure 2
Figure 3

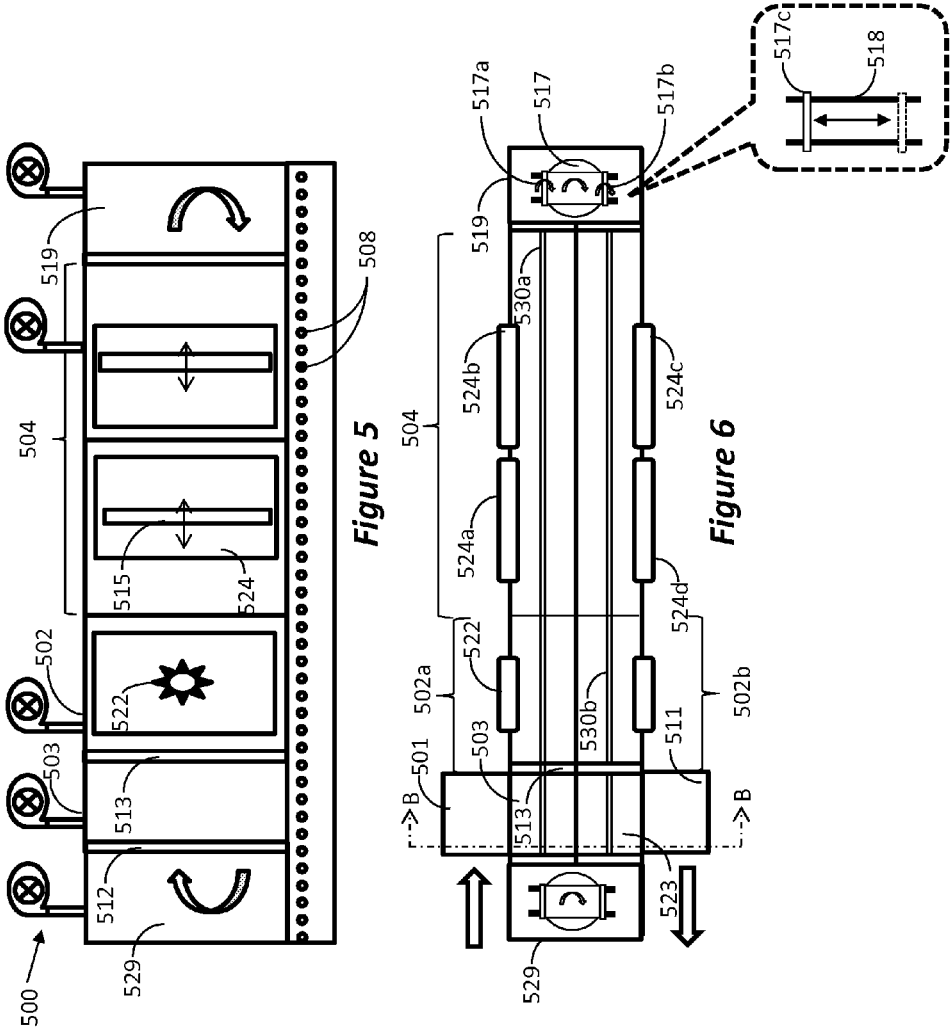
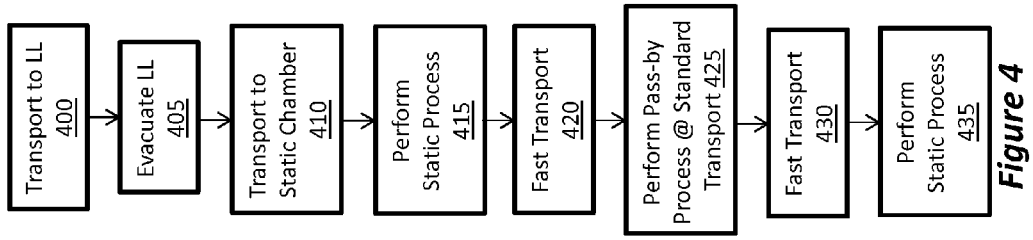

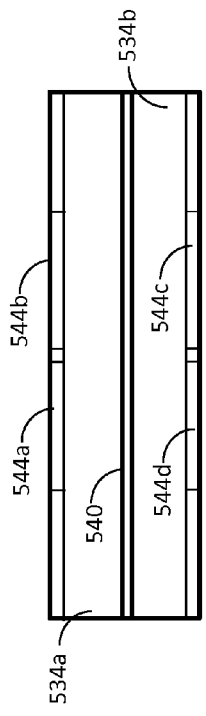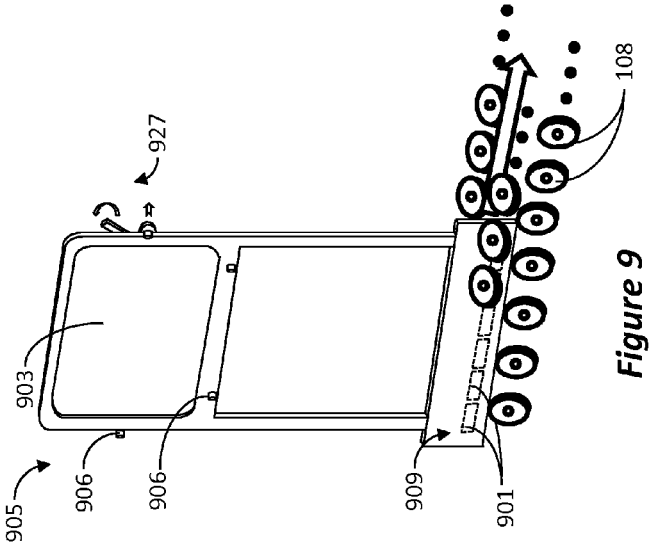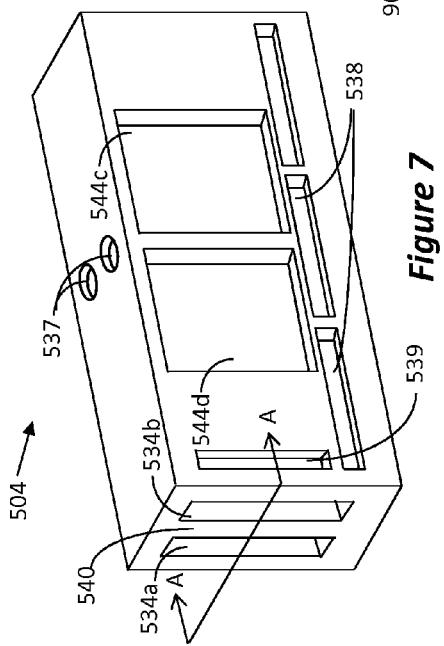

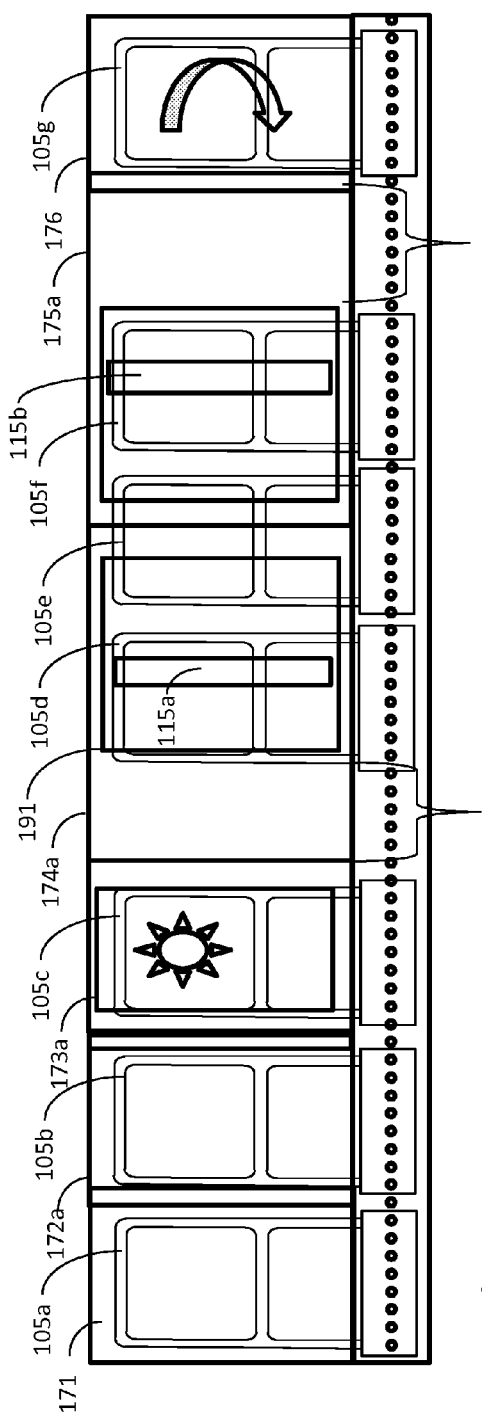
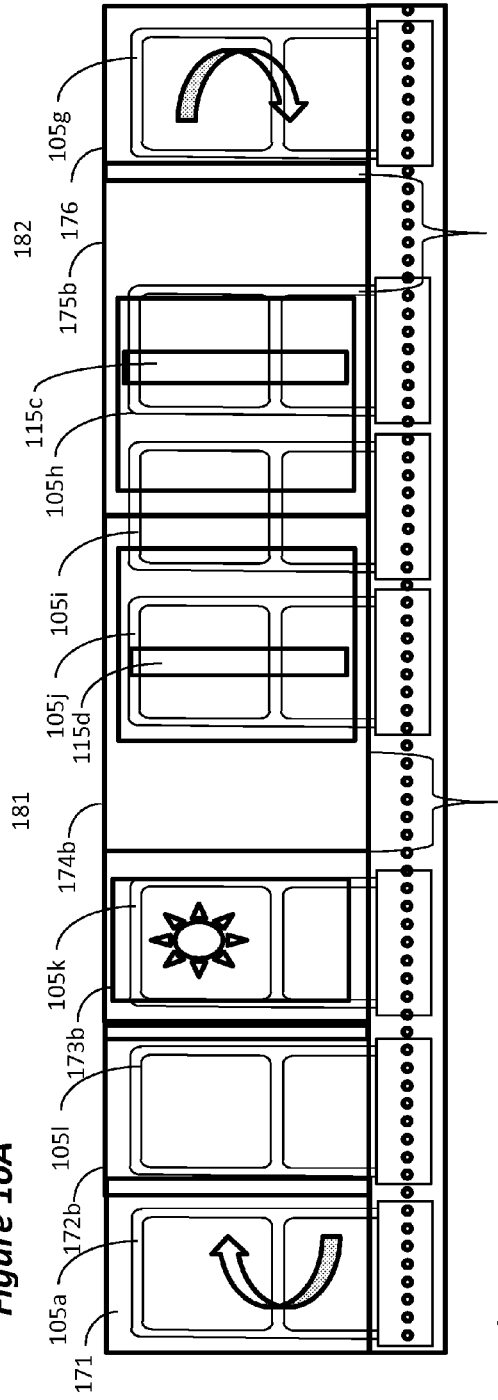
*Figure 10A*
*Figure 10B*

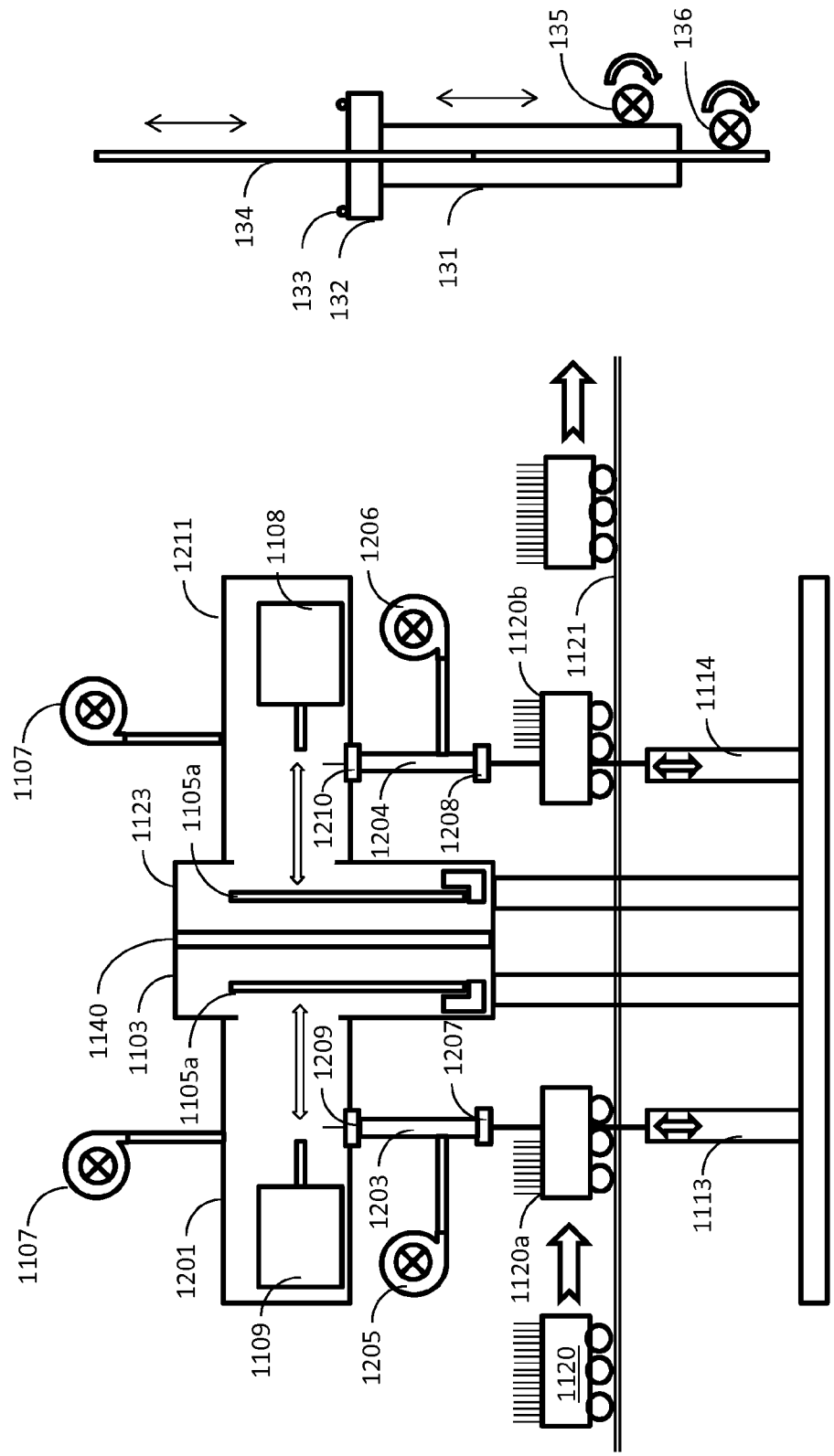

SYSTEM ARCHITECTURE FOR COMBINED STATIC AND PASS-BY PROCESSING

RELATED CASES

This Application claims priority benefit from U.S. Provisional Application Ser. No. 61/580,642, filed on Dec. 27, 2011, the disclosure of which is incorporated herein by reference in its entirety.

BACKGROUND

1. Field

This disclosure relates to a system architecture and method for handling and processing substrates such as magnetic disks, touch-screens, etc., and more specifically, to a system and method for improved process flow of a substrate carrier in a substrate processing system using combined static and pass-by processing.

2. Related Art

Substrate processing, such as the fabrication of magnetic disks, touch-screens, etc., is a complex and complicated process. Large, customized equipment is required to carry out the numerous unique steps of pre-heating, coating a substrate with multiple layers, then annealing and/or cooling the substrate. Machines for processing substrates usually have a large footprint, and require a significant amount of space to operate. Additionally, the machines need to be operated in high-tech clean rooms, which are expensive to build and maintain. Therefore, it is advantageous to reduce the overall footprint of the substrate processing machines.

It is also desired to improve the processing speed at which each substrate unit is fabricated so as to maximize the value, i.e., throughput, of the equipment. Improving the processing speed is somewhat challenging, since many processing steps have a minimum required time that a particular coating must be applied, heated, or cooled in order to properly fabricate a substrate. Additionally, uniformity of the processing over the surface of the substrate is critical for proper performance of the resulting product. Consequently, some processes require static processing, i.e., the substrate is held stationary while processing, while other processes require pass-by processing, i.e., require the substrate to be continuously moved during processing.

To this end, current technology, such as the 200 Lean® system manufactured by Intevac, Inc. of Santa Clara, Calif., offer solutions to reduce the overall footprint of the system. The 200 Lean® is described in further detail in U.S. Pat. No. 6,919,001 (hereafter "the '001 patent"), the disclosure of which is incorporated herein in its entirety. As described in the '001 patent, the system may be operated so as to provide static processing or pass-by processing. Other systems have been described in the art that enable static or pass-by processing.

International Patent Publication No. WO 2006/026886 A1 (hereafter "the '886 publication") also describes a substrate processing system with two stacks of processing chambers to reduce the footprint. Much like the 200 Lean® system described in the '001 patent, the '886 publication describes a lift module to transport a substrate from one stack to the next, and the use of magnetic means, i.e., linear motor, for the transport of the substrate carriers.

However, current systems do not provide workable solution for combining both static and pass-by processing in a single linear system. Therefore, what is needed is an improved substrate processing system that minimizes footprint while enabling both static and pass-by processing.

SUMMARY

The following summary of the invention is included in order to provide a basic understanding of some aspects and features of the invention. This summary is not an extensive overview of the invention, and as such it is not intended to particularly identify key or critical elements of the invention, or to delineate the scope of the invention. Its sole purpose is to present some concepts of the invention in a simplified form as a prelude to the more detailed description that is presented below.

Embodiments of the present invention provide for a substrate processing system which enables combined static and pass-by processing. Embodiments of the invention also provide simplified system construction.

According to aspects of the invention, a system for transporting substrates in a substrate processing system having at least one static processing chamber and at least one pass-by processing chamber is provided. The substrates are processed in a static chamber and in a pass-by chamber without leaving the vacuum environment.

According to other aspects of the invention, a system architecture is provided, which reduces footprint size. The system is constructed such that the substrates are processed therein vertically, and each chamber has a processing source attached to one sidewall thereof, wherein the other sidewall backs to a complementary processing chamber. According to one aspect, the chamber body is milled from a single block of metal, e.g., aluminum, wherein the block is milled from both sides, such that a partition wall remains and separates each two complementary processing chambers.

According to disclosed embodiments a system for processing substrates is provided, comprising: a loadlock chamber for introducing substrates from atmospheric environment into vacuum environment; a loading arrangement for loading substrates onto substrate carriers; wheels for transporting the substrate carriers within the system; a static processing chamber for processing the substrate while the carrier is stationary; a pass-by processing chamber having a transport section and a processing section; and, a transport mechanism configured to transport the carrier in the transport section at a transport speed and to transport the carrier in the processing section at a pass-by speed, wherein the transport speed is faster than the pass-by speed. The transport mechanism may comprise a plurality of wheels that are provided at the base of the static processing chamber and the pass-by processing chamber, and wherein each of the plurality of wheels is energized independently. The transport section and the processing section may be defined within a single un-partitioned enclosure. A turning chamber may be configured for turning the carrier to be transported in the reverse direction and for processing on the opposite side of the system, for processing the same or the opposite side of the substrate. The system may further comprise a second static processing chamber having a common wall with the static processing chamber, and a second pass-by processing chamber having a common wall with the pass-by processing chamber, and wherein the carrier traverses the second static processing chamber and the second pass-by processing chamber in the reverse direction after being rotated in the turning chamber. A first translator can be configured for loading substrates onto substrate carriers and a second translator configured for removing substrates from the substrate carriers. A first loadlock arrangement can be configured for introducing substrates to the first translator, and a second loadlock arrangement configured for accepting substrates from the second translator. A first lifter arrangement can be used for loading substrates onto the first loadlock arrangement, and a second lifter arrangement for removing substrates from the second loadlock arrangement. A first robot arm can be configured for loading substrates from cassettes and onto the first lifter arrangement and a second robot arm configured for unloading substrates from the second lifter arrangement and onto cassettes. Each of the first and second robot arms may be retractable and rotatable.

According to other embodiments, a processing chamber body is disclosed, defining a plurality of processing stations, and comprising: a single chamber body machined out of a single block of metal to define therein a first, second, third, and fourth processing stations; a first substrate transport passage machined out of the single block of metal to traverse the first and second processing stations; a second substrate transport passage machined out of the single block of metal to traverse the third and fourth processing stations; and a wall being common to and separating the first and third processing stations and further being common to and separating the second and fourth processing stations, so as to prevent fluid communication between the first and third processing stations and between the second and fourth processing stations. A first set of conveyor wheels enables substrate transport from the first processing station to the second processing station, and a second set of conveyor wheels enables substrate transport from the fourth processing station to the third processing station.

According to other embodiments, a lifter and loadlock assembly are disclosed, comprising: a loadlock chamber having a lower sealing plate; a lifter assembly comprising a lifter body having an upper sealing plate, the lifter body being extendable to engage the upper sealing plate with the lower sealing plate so as to form vacuum seal, the lifter body further being retractable to disengage the upper sealing plate from the lower sealing plate so as break the vacuum seal; and a lifter blade movable within the lifter body and having mechanism to engage and hold a substrate, and lifter blade being configured to lift or lower the substrate by being extended or retracted within the lifter body.

Additionally, a linear system for processing substrates in vacuum is disclosed, comprising: a first linear arrangement of chambers, the first linear arrangement maintaining vacuum environment and having passages enabling substrate carriers to move from one chamber directly to the next in a first traveling direction; a second linear arrangement of chambers, the second linear arrangement maintaining vacuum environment and having passages enabling substrate carriers to move from one chamber directly to the next in a second traveling direction opposite the first traveling direction; a loading chamber positioned at entry side of the first linear arrangement and configured to introduce substrates from atmospheric environment into the vacuum environment maintained by the first linear chamber arrangement; an unloading positioned at exit side of the second linear arrangement and configured to remove substrates from the vacuum environment maintained by the second linear chamber arrangement out to atmospheric environment; a turning chamber connected to exit side of the first linear arrangement and to entry side of the second linear arrangement and configured to accept substrate carriers from the first linear arrangement and deliver the substrate carriers to the second linear arrangement; wherein each of the first linear arrangement and the second linear arrangement comprises at least one static processing chamber and at least one pass-by processing chamber, the pass-by processing chamber having a processing zone defined therein; and, a substrate carrier transport mechanism configured to: maintain the substrate carriers stationary during processing inside the static processing chamber; move the substrate carriers at transport speed while the substrate carrier is moved inside the pass-by processing chamber, but outside the processing zone; and, move the substrate carriers at pass-by speed while the substrate carrier is moved inside the pass-by processing chamber inside the processing zone, wherein the transport speed is faster than the pass-by speed. A loading lifter is configured to load substrates into the loading chamber; an unloading lifter is configured to remove substrates from the unloading chamber. A retractable blade housing has a vacuum sealing plate at an upper end thereof; a lifting blade is movable inside the retractable blade housing; and, a vertical motion mechanism is coupled to the retractable blade housing and the lifting blade and vertically moving the retractable blade housing and the lifting blade. A loading robot arm is configured to remove substrates from cassettes and deliver the substrates to the loading lifter; and, an unloading robot arm is configured to remove substrates from the unloading lifter and deliver the substrates to the cassettes.

Also, a method of operation is provided for a system having a static processing chamber and a pass-by processing chamber, the method for processing substrates, comprises: introducing the substrate into a vacuum environment; loading the substrate onto a carrier; transporting the carrier into the static processing chamber and holding the carrier in its position during processing inside the static processing chamber; once processing inside the static processing chamber is completed, transporting the carrier into the pass-by processing chamber at transport speed, until the carrier reaches a position behind a preceding carrier positioned within the pass-by processing chamber; once the carrier reaches the position behind the preceding carrier, reducing the speed of the carrier to thereby continue transporting the carrier inside the pass-by processing chamber at a processing speed which is slower than the transport speed.

BRIEF DESCRIPTION OF THE DRAWINGS

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

FIG. 1 is a schematic side-view illustration of a substrate processing system according to one embodiment of the invention.

FIG. 2 is a schematic top-view illustration of a substrate processing system according to one embodiment of the invention.

FIG. 3 is a schematic illustration of an embodiment of a substrate carrier.

FIG. 4 is a general flow chart illustrating a processing sequence that can be carried out in the system, such as that illustrated in FIGS. 1 and 2, according to an embodiment of the invention.

FIG. 5 illustrates a side view of a system 500 according to one embodiment, while FIG. 6 illustrates a top view of the system of FIG. 5.

FIG. 7 illustrates an example of a chamber body for a pass-by processing chamber, while FIG. 8 is a cross-section of the chamber body of FIG. 7, according to an embodiment of the invention.

FIG. 9 illustrates another example of a substrate carrier 905 that can be used in any of the systems disclosed herein.

FIGS. 10A and 10B illustrate an example of a snap-shot in time during operation of a system, such as that illustrated in FIGS. 5 and 6, according to an embodiment of the invention.

FIG. 12 is a schematic illustration of an embodiment wherein loading the substrate into vacuum is done before the substrate is loaded onto the translator mechanism.

FIG. 13 is a schematic illustration of a combination substrate lifter with loadlock vacuum valve, according to an embodiment of the invention.

DETAILED DESCRIPTION

Figure 11:
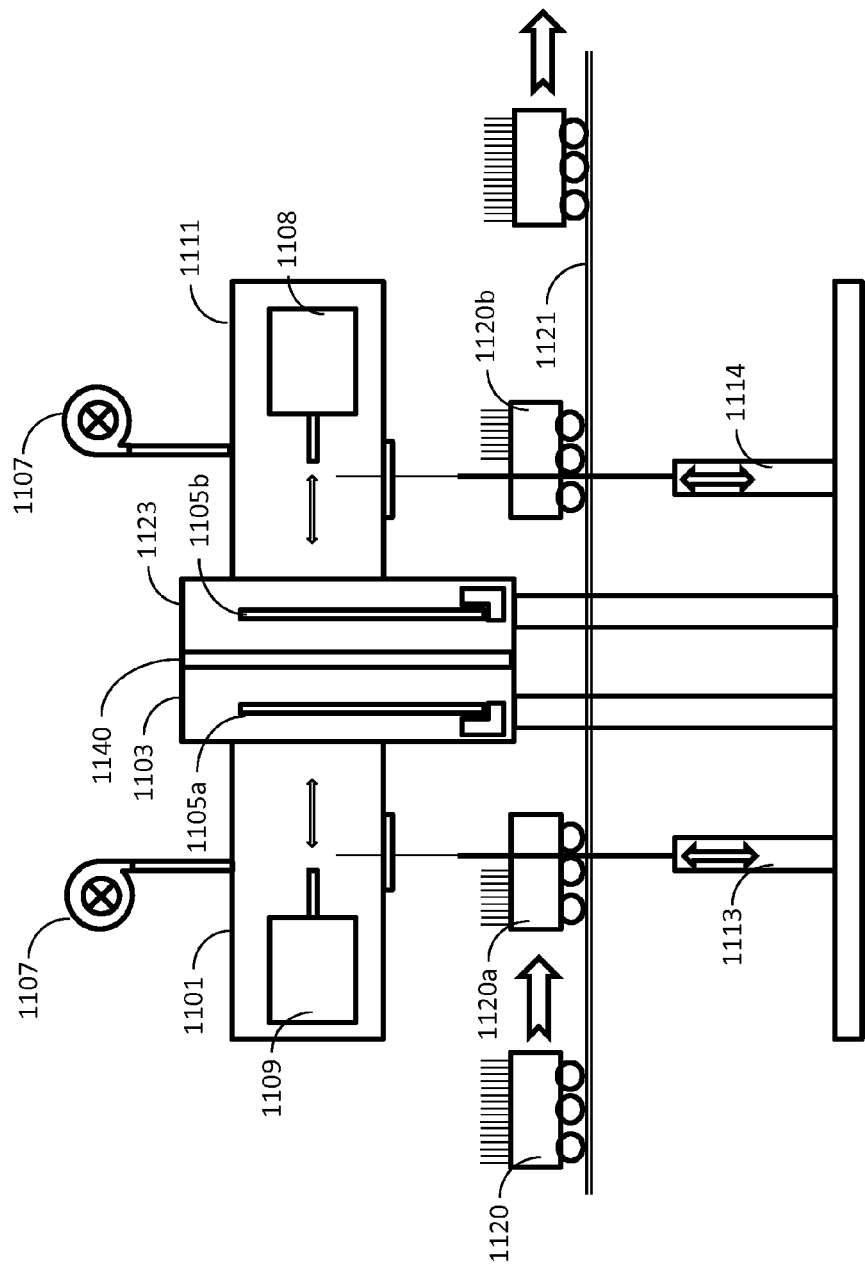
FIG. 11 illustrates an example of a loading and unloading mechanism that can be used in any of the disclosed systems, according to an embodiment of the invention.

The various aspects of the present invention provide for the processing of substrates to fabricated items such as hard disks, ICs, touch screens, etc. The disclosed embodiments illustrate various features, such as combined static and pass-by processing, reduction of footprint, simplified chamber manufacturing, etc. While some of the illustrated embodiments use more than one feature, it should be understood that the features can be implemented independently or in different combinations with various processing systems.

In one aspect of the invention, combined static and pass-by processing of substrates is enabled. As illustrated in the example of FIG. 1, a substrate processing system 100 comprises a linear series of static processing chambers 102 and pass-by processing chambers 104 for applying various coatings or processes to substrates 103. The substrates are mounted onto carriers 105, as shown in more details in FIG. 3. The carrier 105 makes contact with an outer edge of the substrate at only a few points 106, so as to keep the substrates' entire surface area exposed for the coatings and/or other processing. The carrier 105 also has a carrier base 109, which engages rails and motorized wheels 108, so as to move through the chambers 102 and 104 of the system 100. Notably, as will be shown further below, the arrangement of tracks and wheels is only one example and other implementations, such as wheels only without tracks, can also be used.

As can be seen from FIG. 1, the substrate is first processed inside a static chamber 102, i.e., the substrate is stationary during processing, then processed in a pass-by chamber 104, i.e., the substrate moves during processing, then processed in another pass-by chamber 104, and then processed in another stationary chamber 102. This creates a problem of synchronizing motion of the carriers to minimize idle time of the chambers. That is, for high utilization, it is required that each chamber will be always processing a substrate and not be waiting for another chamber to complete processing before moving to another substrate. For example, if chamber 102 completed processing on its substrate, but the next pass-by chamber 104 has not competed processing, then chamber 102 has to sit idle and wait for chamber 104 to complete processing before it can release the completed substrate and start processing on a new one. However, as will be described below, the embodiment of FIG. 1 overcomes this problem, such that none of the chambers is idling and all process substrates at all times.

Prior to explain the solution implemented in FIG. 1, the various elements of the system of this embodiment will be described. In the example illustrated in FIG. 1, the system includes a loadlock 101 through which substrates are introduced from atmospheric condition into the vacuum environment of system 100. Vacuum is maintained by vacuum pumps 107, which may be provided individually to each chamber, or shared among few chambers, as illustrated in the example of FIG. 1. The substrate is then moved into a static processing chamber, in this example a heating chamber 102. In this example, a vacuum valve 112 separates the loadlock 101 from the atmospheric condition, and vacuum valve 113 separates the heating chamber 102 from the loadlock 101. In this particular example, no vacuum valves are provided between the heating chamber 102 and processing chambers 104, nor between processing chambers 104 (two of which are shown in FIG. 1). Of course, such valves can be inserted between these chambers if desired. For example, if static chamber 102 performs plasma processing, rather than mere heating, a vacuum valve should be used to separate it from the pass-by processing chamber 104.

Heating chamber 102 is a static processing chamber, meaning the substrate is held stationary during processing, i.e., during heating. Once the substrate reaches the desired temperature, motorized wheels 108 are energized to move the carrier to the first pass-by processing chamber 104. According to a feature of this example, wheels 108 are first energized to transport the carrier at a high speed, so as to "catch-up" with a substrate that is already being pass-by processed in chamber 104. Once the carrier exits chamber 102, a new carrier can be transported in to chamber 102 for processing, so that chamber 102 does not remain idle. On the other hand, once the carrier catches-up with the carrier ahead of it inside chamber 104, the wheels 108 are slowed down and assume pass-by processing speed, which is much slower than the catch-up speed. Therefore, the wheels need to be driven individually or in groups. Depending on the location of the energized wheels, some will be energized individually, some may be energized in pairs, and some may be energized in groups, e.g., all six or all eight wheels energized together at the same speed. This arrangement is referred to as having the wheels energized at individualized speeds, meaning that not all of the wheels are energized to run at the same speed. Using such an arrangement enables operating the transport system at different speeds at different locations. Thus, different carriers within the system can be transported at different speeds within the system at the same time. For example, at some instance of time, some wheels would be stationary to enable processing at the stationary processing chamber, some wheels would be energized at transport speed to move a carrier into the pass-by processing chamber or into the carrier transport chamber, while other set of wheels would be energized at processing speed to enable processing of a substrate in the processing section of the pass-by processing chamber. Alternatively, a linear motor arrangement can be used.

In this example, the processing chamber 104 is a pass-by processing chamber, meaning, the substrate keeps moving during processing. In this example, two pass-by processing chambers 104 are used, both of which being physical vapor deposition (PVD), also referred to as sputtering chambers. To improve uniformity of the sputtered material on the overall surface of the substrate 103, the substrate carrier keeps moving during sputtering. Further, in this example, the magnetron 115 of the PVD chamber 104 cycles back-and-forth, such that both the substrate and the sputtering source are moved during processing. This provides a high level of sputtering uniformity and target utilization. Of course, a stationary magnetron can also be used while the carrier maintains a pass-by motion.

If the sputtered layer needs to be annealed, a second heating chamber 102 is provided following the processing chambers 104. The second heating chamber 102 is also static processing chamber. Therefore, once the substrate passes the edge of the sputtering magnetron, appropriately selected ones of wheels 108 are energized to assume a fast transport speed to place the carrier inside the second heating chamber 102. Once placed inside the heating chamber 102, the wheels stop and the carrier is stationary during annealing. In the example of FIG. 1, an exit loadlock 111 is provided at the end of the system. The loadlock 111 delivers the substrate from vacuum environment to atmospheric environment.

FIG. 2, is a schematic top-view illustration of a substrate processing system, such as that illustrated in FIG. 1. As illustrated, the heaters 122 and sputtering sources 124 are provided on only one side of the chamber, so that only one surface of the substrate is processed at a time. Also illustrated in FIG. 2 are the rails 130, which in conjunction with motorized wheels 108 are used to transport the carriers 105. In this embodiment, as shown in FIG. 3, the base 109 of carrier 105 includes extensions 127 and wheels 129, that engage the rails 130 and wheels 108 so as to transport the carrier in an erect orientation throughout the entire system. In this embodiment, at least one set of wheels 108 and 129 are magnetized wheels, to provide enhanced traction. Also, if a linear motor is used, a series of magnets 101 are attached to the base of the carrier.

FIG. 4 is a general flow chart illustrating a processing sequence that can be carried out in the system, such as that illustrated in FIGS. 1 and 2. In step 400 the substrate is transported into the loadlock and is loaded onto the carrier. The loadlock is then evacuated in step 405 and, when evacuation is completed, in step 410 the carrier is transported into the static processing chamber and is "parked" in the static processing chamber. In step 415 static processing is performed, e.g., the substrate is heated while the substrate is held stationary. Once static processing is completed, e.g., the substrate reached the desired temperature, in step 420 the carrier performs fast transport so as to enter pass-by processing chamber and assume a position behind a carrier that is already being processed inside the pass-by processing chamber. Once the carrier reaches the position behind the forward carrier, it reduces its speed and assumes pass-by transport speed, so that in step 425 pass-by processing is performed at pass-by speed. Note that since the carrier moves from the static chamber to the pass-by chamber at a fast transport speed to "catch-up" with the previous substrate, from the sputtering chamber perspective there is always a substrate being processed. That is, the sputtering chamber is fully utilized all of the time and the chamber performs continuous sputtering as an "endless" series of substrates are being moved one behind the other at pass-by processing speed. Consequently, the sputtering source does not need to be turned on and off repeatedly and there's not a time wherein there is no substrate inside the chamber being processed. Thus, the sputtering source is fully utilized. Conversely, once the carrier leaves chamber 102 at transport speed, a new carrier can be introduced into chamber 102 for static processing.

Description will now be made of another embodiment, which doubles the number of processing chambers without a significant increase in the footprint. Such an example is illustrated in FIGS. 5 and 6. FIG. 5 illustrates a side view of a system 500 according to one embodiment, while FIG. 6 illustrates a top view of the system of FIG. 5. The embodiment illustrated in FIGS. 5 and 6 can be thought of as two systems of FIG. 1 placed back-to-back. In addition to increasing processing capacity with only a small increase in footprint, such an arrangement is advantageous in that the substrates enter and exit the system from the same side. This is very beneficial for cleanroom environment, wherein the substrates arrive from one side of the cleanroom wall, enter the system that operate behind the wall, and exit the system to that same side of the cleanroom wall as the entry.

With continued reference to FIGS. 5 and 6, the substrates enter the system through entry loadlock 501 and are then moved to loading chamber 503, wherein the substrates are loaded onto carriers. The carriers are transported via wheels 508 or ride on tracks 530a and 530b and linear motors (not shown). The wheels 508 transport the carrier first into static processing chamber, e.g., heating chamber 502a. During processing in chamber 502a the carrier is stationary. Once processing is completed in chamber 502a, e.g., the substrate reached the proper temperature, the carrier is accelerated to a fast transport speed, so as to "catch-up" with the carrier that is already inside processing chamber 504. Once the carrier reached the preceding carrier, it is slowed down and continues transport at pass-by speed, which is slower than the fast transport speed. As shown in FIG. 6, pass-by processing chamber 504 has four sputtering stations, corresponding to sputtering sources 524a, 524b, 524c and 524d, which are positioned in pairs back-to-back. Therefore, in this example the substrate is first processed by sputtering sources 524a and 524b. Once processing at station 524b is completed, the carrier is again accelerated to a fast transport speed to enter the carrier transfer chamber 519. In this example, carrier transfer chamber 519 includes a turntable 517 that takes the carrier from the first path, e.g., from tracks 530a, to a second path, e.g., to tracks 530b, going in the opposite direction. Once on tracks 530b, the carrier is again accelerated and assumes a pass-by processing transport speed so as to be processed by sputtering source 524c and then 524d. Once processing is completed in sputtering station 524d, the carrier is again accelerated into heating chamber 502b for stationary annealing, if needed. Once annealing is completed, the carrier is transported into unloading chamber 523, wherein the substrate is removed from the carrier and moved into loadlock 511. The unloaded carrier is then moved into turning chamber 529, wherein the carrier is moved from tracks 530b to tracks 530a, to be reloaded with fresh substrate in loading chamber 503.

As illustrated in FIG. 6, in the embodiment where the carrier transport chamber 519 includes a turntable 517, the turntable 517 has two carrier seats 517a and 517b. If the substrate is to be processed on only a single surface, the carrier seats 517a and 517b are stationary, such that when the turntable makes a 180° turn, the carrier seated on seat 517a would be placed at the location previously occupied by seat 517b, such that the carrier that traversed tracks 530a may now go in the reverse direction on tracks 530b. When the seats are stationary, the same surface that was processed by sputtering sources 524a and 524b will be processed by sputtering sources 524c and 524d. On the other hand, if it is desired that sources 524c and 524d will process the opposite surface of the substrate, then seats 517a and 517b are made to rotate 180° at the same time that turntable 517 rotates. This is illustrated by the curved arrows in FIG. 6. Alternatively, as illustrated in the callout, the turntable is eliminated and instead one carrier seat 517c rides linearly back and forth on tracks 518 (exemplified by the double-headed arrow). If processing on the same side of the substrate is desired, then seat 517 would rotate 180° at the same time that it moves linearly to the second path position (shown in broken line). It should be noted, however, that while in this example the carrier transport chamber may carry one or two carriers, in other embodiments provisions may be may to store more than two carriers inside the carrier transport module.

FIG. 7 illustrates an example of a chamber body for a pass-by processing chamber, such as chamber 504, while FIG. 8 is a cross-section of the chamber body of FIG. 7. According to this embodiment, the chamber body is fabricated from a single piece of metal, such as aluminum, so as to provide four processing stations, positioned back-to-back in pairs. In this example, a single piece of aluminum is milled to fabricate through passages 534a and 534b, wherein the tracks will be placed and through which the carriers are transported. As is illustrated, when through passages 534a and 534b are milled, a partition wall 540 remains and separates the chamber body into two parts, symmetric about the partition wall 540. Also, through each face, pair of holes is milled to enable placing of the sputtering sources. In this example, pair 544a and 544b are milled opposite pair 544c and 544d. Additionally, access holes 538 are milled to enable placing of the motorized wheels 508. If needed, holes 537 are also milled so as to provide access to vacuum pumps and holes 539 can be milled for vacuum valves. Similarly, other threaded or unthreaded holes can be milled to provide attachment points to parts such as chamber attachments and/or supports, etc.

FIG. 9 illustrates another example of a substrate carrier 905 that can be used in any of the systems disclosed herein. Carrier 905 differs from carrier 105 in that it has no wheels. Instead, all of the wheels, including magnetic and motorized wheels for traction and transport are affixed inside the various loadlocks and chambers of the system. In this embodiment, the system has no tracks, rather the base of each chamber has motorized wheels and idle wheels (collectively referred to as wheels 108—note that only a few wheels are illustrated in FIG. 9, with the three dots indicating that the wheel arrangement continues throughout the entire path.) that maintain and transport carrier 905 in a vertical orientation. Base 909 engages the wheels and maintains vertical orientation throughout the processing and transport. This arrangement enables making the carriers very thin, such that the loadlock chamber can be evacuated very rapidly and the vacuum valve can be opened and closed very fast due to very short travel of the gate blade. The substrate is held in space 903 by contacts 906, two (or more) of which are stationary and two of which are movable by clips 927 (only one clip visible in FIG. 9). When clips 927 are moved as shown by the arcuate arrow, the pins retracts and allow for placement of a substrate. The clips can then be released and contacts 906 are then springly urged against the substrate. Also, as shown in broken lines, if a linear motor is used instead of motorized wheels, a series of permanent magnets 901 can be placed on base 909, to provide motive force in conjunction with the linear motor coils (not shown) that will be placed in the base of the chambers. Similar arrangement can be made with the other carriers disclosed herein.

FIGS. 10A and 10B illustrate an example of a snapshot in time during operation of a system, such as that illustrated in FIGS. 5 and 6. As shown, several carriers operate within the system continuously. Carrier 105a is shown in the turning station 171, after a substrates was removed from the carrier in unload chamber 172b (FIG. 10B), and the carrier is now ready to move into the loading station 172a. At this time, carrier 105b is in loading station 172a, has already been loaded with a substrate, and is ready to move into heating station 173a. In heating station 173a, the substrate on carrier 105c has reached its prescribed temperature and the carrier is just about to leave the chamber and accelerate to fast transport speed to catch up with carrier 105d. In processing chambers 174a and 175a, which, in this example, are two sputtering chambers with open passage in between them, three carriers 105d-105f, are moving at processing speed, one following the other, as the substrates are being deposited with sputtered material from a sputtering source. As shown, this snapshot is taken just after carrier 105g has completed processing in chamber 175a and has accelerated into turning chamber 176. From there, the carrier will be positioned to traverse the other side of the system, illustrate in FIG. 10B, in the reverse direction, and will then arrive at the position where carrier 105a now stands.

As shown in FIG. 10B, carriers 105h-105j are moving, one behind the other, at processing speed in front of the sputtering sources of chambers 174b and 175b. Carrier 105k is stationary in annealing station 103b, while carrier 105l is stationary in unload station 102b, wherein the substrate is unloaded from the carrier. From there the carrier will assume the position shown by carrier 105a in turning station 171.

As can be appreciated, the space in front of the sputtering sources 115a-115d is constantly occupied with substrates, such that the sputtering sources 115a-115d continuously operate and are, therefore, fully utilized. On the other hand, the heating and annealing processes can be performed in a static mode, thereby simplifying the size and construction of these chambers. To enable comingling static and pass-by processing chambers, two transport speeds are utilized: fast transport speed and pass-by processing speed. In this example, this is achieved by having the motorized wheels operable in at least three modes: stop, processing speed, and fast transport speed, which is faster than processing speed. In this example, each transport wheel can be operated independently in each of the modes; however, alternatively, the wheels can be operable in groups according to their position. For example, the wheels at the center of the sputtering chamber may never need to operate at fast transport speed, but only at pass-by processing speed. Similarly, wheels close to the entrance and exit of the sputtering chamber may never need to operate at pass-by processing speed, but only at fast transport speed.

Also, the pass-by processing chambers are sized such that a dead-space 181 at the entrance side enables entering carrier to start processing from its leading edge and continue processing the entire substrate through pass-by, while a dead-space 182 at the exit side enables exiting carrier to complete processing up to the trailing edge of the substrate, before accelerating into the turning chamber. The dead-space 181 at the entrance also provides space for the entering carrier to accelerate and to catch up with the previous carrier, prior to having the leading edge of its substrate entering the processing zone. As such, dead-space 181 can also be referred to as the transport section of the processing chamber; while the remaining part of the chamber can be referred to as the processing section. While not drawn to scale, FIG. 10 exemplified dead-space 181 which is sized so that carrier 105c can accelerate and catch up to carrier 105d, before the trailing edge of the substrate on carrier 105d reaches the leading edge 191 of the sputtering source 124. Therefore, in this example the transport section is made wider than the width of the substrate. In this manner, a new carrier can be accommodated within the pass-by processing chamber before sputtering process is completed on the entire surface of the prior substrate.

FIG. 11 illustrates an example of a loading and unloading mechanism that can be used in any of the disclosed systems. The example of FIG. 11 is illustrated as a cross-section along lines B-B in FIG. 6. FIG. 11 shows the loadlock chamber 1101 coupled to loading chamber 1103 and loadlock chamber 1111 coupled to unloading chamber 1123. The chambers are evacuated by vacuum pumps 1107. Alternatively, and as will be explained further below, chambers 1101 and 1111 are maintained at the same vacuum environment as their corresponding loading and unloading chambers 1103 and 1123, such that no gate is provided between chamber 1101 and 1103 and between chambers 1111 and 1123. That is, a free passage is provided between chamber 1101 and 1103 and between chambers 1111 and 1123. Such an arrangement will be explained more fully with respect to the embodiments of FIGS. 12-15.

Cassettes 1120 travel on rails 1121 to bring fresh substrates to the processing system and remove processed substrates from the system. Cassette 1120a is shown in loading position, wherein lifter 1113 vertically lifts fresh substrates one by one into loadlock 1101. In loadlock 1101 a translator 1109 removes the substrate from lifter 1113 and moves it horizontally so as to load the substrate onto carrier 1105a. On the other side of partition wall 1140, translator 1108 removes substrate from carrier 1105b and delivers it to lift 1114. Lift 1114 lowers the substrate onto cassette 1120b.

As can be appreciated, due to the size of the substrate and the size of the translator mechanism, the loadlock chambers 1101 and 1111 may be rather large, such that it may take too long to pump vacuum each time that a new substrate is introduced. This is especially the case when the substrate is horizontally moved by the translator in vertical orientation. If this indeed becomes a problem, it can be overcome in various ways. For example, several substrates may be loaded into the loadlock before pumping begins, so that several carriers can be loaded by the translator one after the other, before another batch needs to be loaded into the translator chamber. While this is a viable solution, it complicates the structure of the translator mechanism and still requires periods where no carrier can be loaded since the translator chamber needs to be loaded and pumped down to vacuum environment. Another solution is illustrated in FIG. 12.

FIG. 12 is a schematic illustration of an embodiment wherein loading the substrate into vacuum is done before the substrate is loaded onto the translator mechanism. In FIG. 12, elements that are similar to those shown in FIG. 11 are identified with like reference numbers. As shown in FIG. 12, chambers 1201 and 1211 have un-gated openings to, and enabling sharing atmosphere with, their respective loading and unloading chambers 1103 and 1123, respectively, and enabling free passage of substrates between these chambers. Thus, in essence they do not serve as loadlocks, in the sense that they are not cycled between atmospheric and vacuum environment. Thus, in essence they are simply extensions of the loading and unloading chambers 1103 and 1123, respectively, and may also be referred to as translator chambers.

Translator chamber 1201 has a loading loadlock 1203 attached to its floor. Loading loadlock 1203 has lower vacuum valve 1207 interfacing to the atmosphere, and upper vacuum valve 1209 interfacing to the translator chamber 1201. The loading loadlock 1203 is basically a tube of rectangular cross-section and made to have a very small interior volume, basically just a bit larger than the substrate itself, so that it can be easy to rapidly evacuate it by pump 1205. That is, the interior of loading loadlock 1203 is made to have the same shape as the substrate, only slightly larger. Translator chamber 1201 is maintained in constant vacuum by pump 1107. Alternatively, proper piping with valves can be employed such that only one pump can be used to evacuate both translator chamber 1201 and loading loadlock 1203.

When valve 1207 is open and valve 1209 is closed, the lifter 1113 loads a substrate into loadlock 1203. Then valve 1207 is closed and pump 1205 evacuates the loadlock chamber 1203. Once evacuation is completed, valve 1209 is opened and the substrate is loaded onto the translator 1109. This is enabled by having upper portion of the lifter 1113 slide freely within valve 1207. The reverse process is done for unloading. That is, when both valves 1208 and 1210 are closed, pump 1206 evacuates the unloading loadlock 1204. Then valve 1210 is opened, while valve 1208 is kept closed, and a substrate is unloaded from the translator 1108 and loaded onto the loadlock 1204. Then valve 1210 is closed, valve 1208 is opened, and the substrate is removed from the loadlock 1204 and loaded onto cassette 1120b.

FIG. 13 is a schematic illustration of a combination substrate lifter with loadlock vacuum valve. The embodiment illustrated in FIG. 13 can be used in systems such as that exemplified in FIG. 12. In FIG. 13, main body 131, which serves as a housing for the lift element 134, can be moved vertically via motor 135. Lifter element 134, such as a lift blade, freely rides inside main body 131 and is moved vertically via motor 136. In this embodiment, the vertical motion mechanism comprising motors 135 and 136 impart vertical motion to the main body 131 and lifter element 134, such that they are moved independently of each other. A sealing plate 132 having seal 133 is affixed to the top end of the main body 131. The sealing plate 132 is configured to engage a complementary sealing plate, e.g., 1207 in FIG. 12, and form a vacuum seal therewith.

In operation, from an initial position wherein both the main body 131 and lifter element 134 are in their lower position, a substrate is positioned on the tip of the lifter element, e.g., lift blade, 134. Then both main body 131 and lifter element 134 are raised to a position wherein the substrate is completely within the loadlock, e.g., loadlock 1203 in FIG. 12, and the seal plate 132 engages the complementary seal plate on the loadlock so as to form a vacuum seal. Then vacuum is drawn in the loadlock. Once vacuum condition is reached, valve 1209 is opened and then the lifter element 134 is raised further by sliding freely inside main body 131, so as to position the substrate within reach of the translator, so that the translator can engage the substrate. The lifter element 134 can then be lowered, to enable closing of the valve 1209. Once the valve 1209 is closed, the loadlock can be brought back to atmospheric pressure and the main body 131 and lifter element 134 are lowered to their initial position to receive another substrate.

As can be seen in FIG. 12, the lifter is configured to move the substrate vertically with the substrate being held by the lifter in vertical orientation, and the translator is configured to move the substrate horizontally, with the substrate being held by the translator in vertical orientation. The carriers are also configured to hold the substrates in vertical orientation. Thus, once the substrate leaves the cassette, it assumes a vertical orientation throughout the transport and processing inside the system, until it is returned into the cassette. Inside the cassette the substrate may be position in a vertical or horizontal orientation, as will be explained further below.

Figure 14:
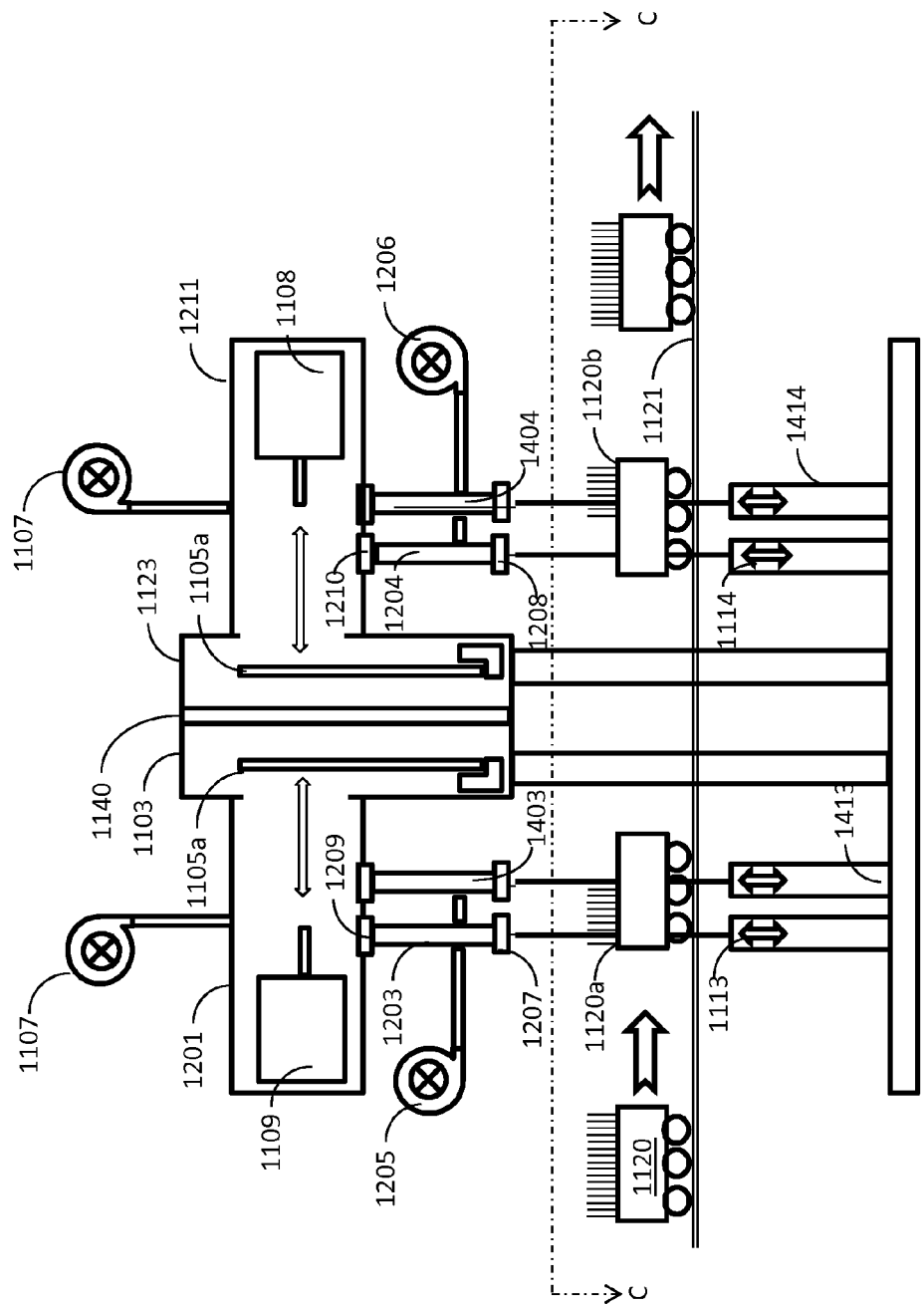
FIG. 14 illustrates another example of a system, which provides enhanced throughput of substrate loading.

FIG. 14 illustrates another example of a system, which provides enhanced throughput of substrate loading. The system illustrated in FIG. 14 is similar to that illustrated in FIG. 12, and elements similar to that of FIG. 12 are identified by like reference numbers. The embodiment of FIG. 14 enables even faster loading of substrates than that of FIGS. 11 and 12 by including two loadlocks on the loading side and two loadlocks on the unload side. On the loading side, a first loadlock 1203 and a second loadlock 1403 can be made in the manner similar to that explained with respect to FIG. 12, with the combination valve-substrate loading mechanism illustrated in FIG. 13. That is, combination valve-substrate loading mechanism 1113 operates in conjunction with loadlock 1203, while combination valve-substrate loading mechanism 1413 operates in conjunction with loadlock 1403. In operation, when one side, e.g., loadlock 1203 is being pumped to vacuum level, the other side, e.g., 1413 can be loaded with fresh substrate and raise to loadlock 1403. Then, when loadlock 1403 starts the vacuum pumping operation, the substrate in loadlock 1203 can be raised to translator 1109 and then pumped up to atmospheric level to prepare for re-loading of another substrate. Similar operations can be performed on the unload side, wherein combination valve-substrate loading mechanism 1114 operates in conjunction with loadlock 1204 and combination valve-substrate loading mechanism 1414 operates in conjunction with loadlock 1404.

In the embodiment of FIGS. 11-14 the substrates are seen as lifter by the lifting blades directly from the cassettes. However, such an arrangement is not always workable. For example, in some fabrication facilities the cassettes are generally arranged such that the substrates are positioned inside the cassettes in a horizontal orientation. In such a facility, the lifting blades will not be able to lift the substrates out of the cassettes, since lifting blades are designed to engage vertically oriented substrates. Additionally, in some systems the tracks for transporting the cassettes are not aligned with the loading chamber of the processing systems, such that the substrates cannot be simply lifted vertically to enter the loading chamber.

Figure 15:
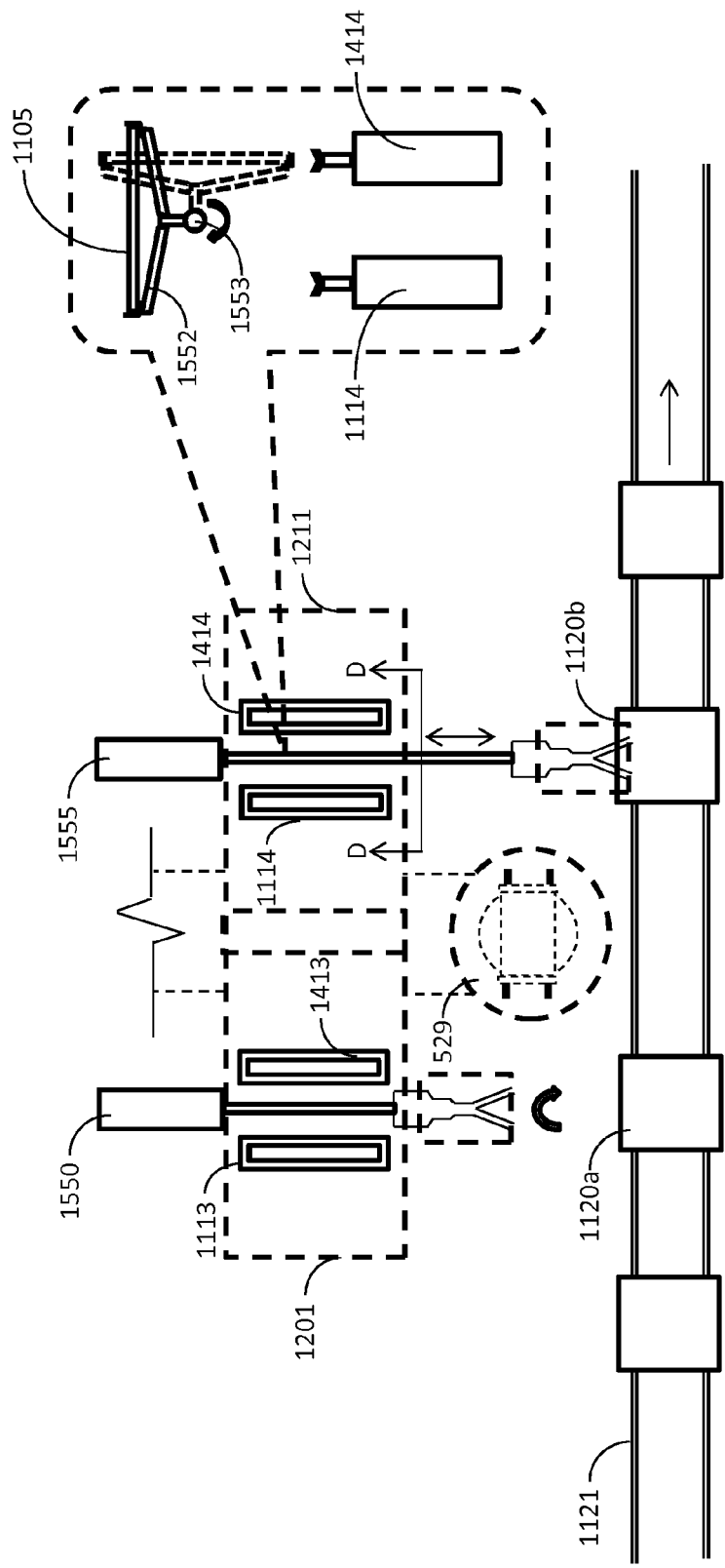
FIG. 15 is a schematic illustration of an arrangement for unloading and loading substrates onto the cassettes, according to an embodiment of the invention.

FIG. 15 is a schematic illustration of an arrangement for unloading and loading substrates onto the cassettes, wherein the substrates are maintained inside the cassettes in horizontal orientation, and wherein the tracks for transporting the cassettes is remote and is not aligned with the loading and unloading chambers. Therefore, the example of FIG. 15 provides solutions to both problems highlighted in the preceding paragraph. The embodiment of FIG. 15 is shown as implemented in the system of FIG. 14, and is illustrated as a cross-section along lines C-C in FIG. 14. Elements in FIG. 15 that are similar to elements in other Figures are identified with the same reference numbers. In FIG. 15, the tracks 1121 for the cassettes 1120a, 1120b, etc., are positioned ahead, rather than under the loading section of the system. For example, tracks 1121 are shown in front of the turntable chamber 529 and translator chambers 1201 and 1211. Note that turntable chamber 529 and translator chambers 1201 and 1211 are shown in broken-line as they are positioned above the section line C-C.

Robot arms 1550 and 1555 are both retractable and rotatable, as shown by the double-headed arrow and the rotation arrow. For loading each substrate to the system, the robot arm 1550 extends to remove a substrate from cassette 1120a. It then retracts to be aligned with one of lifters 1113 or 1413, and rotates so that the lifter can engage the substrate at its edge and remove it from the robot arm. In this manner, robot arm 1550 can load substrates to both lifters 1113 and 1413. Similarly, to unload substrates from the system, robot arm 1555 assumes its retracted and rotated position, such that a substrate from either lifter 1114 or 1414 can be loaded onto the robot arm. Once a substrate is loaded onto the robot arm 1555, it extends and rotates so that it can place the substrate onto cassette 1120b.

In the system of FIG. 15, the substrates are processed only on one surface. If the substrates in cassette 1120a have a pre-defined back and front surface, than it is important to place the proper surface pointing towards the processing sources. For example, it is important that the substrates be placed such that the sputtering layer is deposited on the correct (front or rear) surface of each substrate. This can be done by either placing the substrates in the cassettes in an alternating orientation, e.g., face up, face down, face up, face down, etc., such that when the robot places the substrates onto lifters 1113 and 1413 one after the other, they will all face the same direction once they are loaded onto translator chamber 1201. That is, the robot would rotate in one direction, e.g., clockwise to place the substrate onto lifter 1413, but would rotate in the other direction, e.g., counterclockwise, when placing the substrate onto lifter 1113.

On the other hand, since the cassettes are transported among other systems in the factory, and since most conventional machines expect the substrates in the cassettes to all face in the same direction, it would be beneficial to have a system to load the substrates properly, even if they all face the same direction inside the cassette. To accomplish this, according to one embodiment the robot arm is made to rotate always in the same direction, e.g., clockwise direction. However, the robot arm engages the substrates from underneath and from the top, in an alternating manner. For example, to load the first substrate from the cassette 1120a, robot arm 1550 engages the first substrate from underneath, retracts and rotates 90 degrees clockwise, so as to load the first substrate onto lifter 1413. Then the robot arm 1550 rotates another 90 degrees clockwise and extends, such that it engages the second substrate from the top. It then retracts and rotates another 90 degrees clockwise so as to load the substrate onto lifter 1113. It then rotates another 90 degrees clockwise and extends, so as to engage the third substrate from underneath, and so on and so forth. In this manner, although the robot arm rotates always in the same direction, and although the substrates are arranged in the cassettes to face the same direction, when the substrates are introduced into translator chamber 1201, they all face the same direction as well.

The callout in FIG. 15 provides a front view of the robot arm 1555 to better illustrate the rotation of the robot arm and lifting of the substrates by the two lifters 1114 and 1414. Robot 1555 grabs and holds substrates 1105 via clips 1552 and takes the substrate 1105 out of the cassette. The robot arm 1555 then rotates 90° about shaft 1553, such that the substrate 1105 is aligned with the lifter 1414, as shown by broken lines. After the substrate 1105 has been lifter by the lifter 1414 the robot arm 1555 would extend and rotate another 90°, so as to pull another substrate from the cassette, but this time at a direction opposite than for the previous substrate. That is, if the robot arm grabbed the first substrate by engaging its clips from the top of the substrate, the robot arm would grab the second substrate by engaging its clips from under the substrate. The robot arm would then retract and rotate another 90°, so as to align the substrate with lifter 1114.

Figure 16:
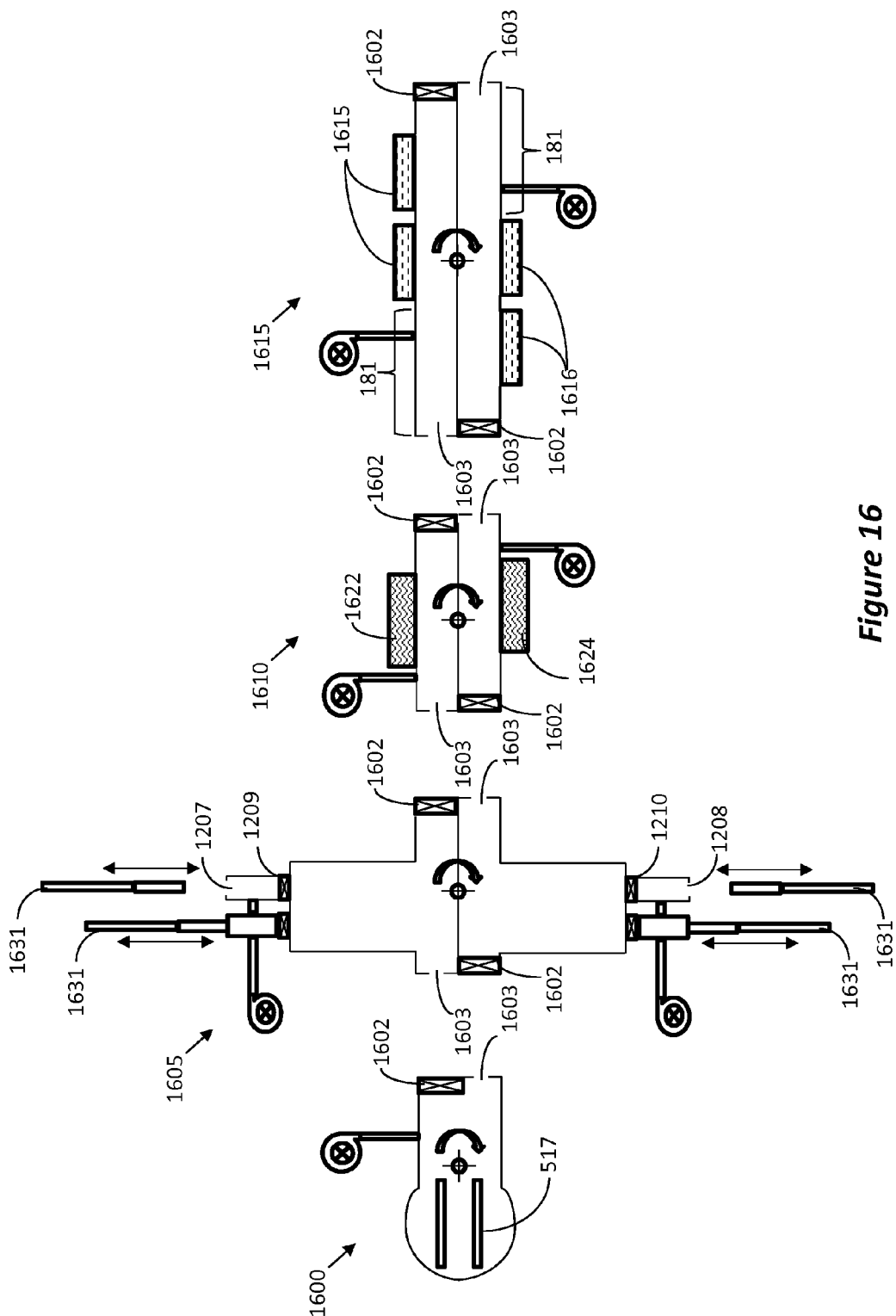
FIG. 16 illustrates a modular arrangement according to an embodiment of the invention.

FIG. 16 is a schematic illustration of another embodiment, highlighting the modularity of the system. In this embodiment, four general elements are provided, which can be mixed and matched to generate different systems as needed. The general elements of the system of FIG. 16 are: carrier transport module 1600, substrate load/unload module 1605, static processing module 1610, and pass-by processing module 1615. These four modules are the building blocks and various system configurations can be built using one or more of any of the building blocks in various combinations. Each of the building blocks has its own vacuum facilities and is directly connectable to any other building block, such that one module provides a vacuum valve that fits on an opening on the mating module. Additionally, the modules are configured to be rotationally symmetrical (indicated by the center of gravity symbol and curved arrow), that is, each of the load/unload, static processing and pass-by processing modules can be rotated 180° and would it fit to its mating chambers in the same position. The carrier transport module is also configured to be rotationally symmetrical; except that when it is rotated 180° it would it fit on the opposite side of the system. Additionally, each of the load/unload, static processing and pass-by processing modules has two identical vacuum chambers positioned back to back, such that one side forms a first processing path starting from the loading module, and the second side forms the second processing path ending at the unloading module.

In this example, carrier transport module 1600 may have a turntable or a linearly movable carrier seat 517, as explained with respect to the other embodiments. In FIG. 16 the carrier transport module 1600 is shown oriented to be positioned on the left side of the system. Another carrier transport module 1600 can be used in a 180° rotated orientation and be positioned on the right side of the system. The transport module 1600 is shown to have its own vacuum pumping facility and has a vacuum valve 1602 on one side/transport path, and an opening 1603 on the other side/transport path. Similar arrangement of vacuum valve 1602 and opening 1603 are provide on each side of the other modules 1605, 1610 and 1615. As can be appreciated, each valve 1602 is configured to be mated with an opening 1603 of a mating module.

As noted, the load/unload module 1605 is symmetrical, such that either side may be used as load side, while the opposite side would be the unload side. Substrate loaders 1631 can be configured similar to lifters 1113 in the embodiment of FIG. 12; however, the loading may done from below as in FIG. 12 (in which case FIG. 16 is a "folded" illustration), or may be done from the side as illustrated in FIG. 16. In this embodiment, each of the loading and unloading sides has two loaders 1631. As in the embodiment of FIG. 12, the loaders are configured to seal openings 1207 and 1208, and to operate with vacuum valves 1209 and 1210. The openings 1603 and vacuum valves 1602 on either side of the load/unload module 1605 can mate with any of the other modules, such that the loading/unloading module 1605 can be placed at any position in the system.

The static processing module 1610 may be used for, e.g., heating, cooling, static deposition, static etching, etc. The two sides of the module 1610 are identical, but on each side a different static processor can be installed. For example, static processor 1622 can be a heater, while static processor 1624 can be a heat sink to cool the substrate. However, the processing module 1610 is built such that any processor can be mounted on any processing side, and may also be replaced with another processor at any time.

Pass-by processing module 1615 has a similar structure to the pass-by processing chamber 504 shown in FIG. 7. Each vacuum chamber of has dead-spaces 181 similar to that shown in FIGS. 10A and 10B. Depending of the type of processing and the number of processor installed on the pass-by module 1615, dead space 182 may also be provided. Each vacuum chamber has provisions for installation of one or more processors. For example, two magnetrons 1615 are provided on one chamber and two magnetrons 1616 are provided on the other chamber. All of the magnetrons 1616 and 1615 may deposit the same material on the substrate, or magnetrons 1615 deposit one type of materials while magnetrons 1616 deposit a different type of material. Furthermore, each of magnetrons 1615 may deposit a different material, while each of magnetrons 1616 may deposit a different type of material, which may mirror the arrangement of magnetrons 1615. Of course, the number of magnetrons provided on each vacuum chamber may be selected according to the desired processing.

It should also be noted that while in describing the above embodiment it was assumed that the carrier travel continuously in one direction within a pass-by vacuum chamber, other arrangement may be implemented. For example, while one carrier is stationary inside the dead zone, the carrier in the processing side of the pass-by chamber may oscillate back and forth in front of the processor. Having the carrier oscillate back and forth in front of a magnetron can assist in depositing uniform layer over the substrate. Moreover, the carrier with the substrate being processed in the processing zone of the pass-by processing chamber may be held stationary for a certain period of time for specific processing.

While the disclosed embodiments are described in specific terms, other embodiments encompassing principles of the invention are also possible. Further, operations may be set forth in a particular order. The order, however, is but one example of the way that operations may be provided. Operations may be rearranged, modified, or eliminated in any particular implementation while still conforming to aspects of the invention.

All directional references (e.g., upper, lower, upward, downward, left, right, leftward, rightward, top, bottom, above, below, etc. are only used for identification purposes to aid the reader's understanding of the embodiments of the present invention, and do not create limitations, particularly as to the position, orientation, or use of the invention unless specifically set forth in the claims. Joinder references (e.g., attached, coupled, connected, and the like) are to be construed broadly and may include intermediate members between a connection of elements and relative movement between elements. As such, joinder references do not necessarily infer that two elements are directly connected and in fixed relation to each other.

In some instances, components are described with reference to "ends" having a particular characteristic and/or being connected to another part. However, those skilled in the art will recognize that the present invention is not limited to components which terminate immediately beyond their points of connection with other parts. Thus, the term "end" should be interpreted broadly, in a manner that includes areas adjacent, rearward, forward of, or otherwise near the terminus of a particular element, link, component, member or the like. It is intended that all matter contained in the above description or shown in the accompanying drawings shall be interpreted as illustrative only and not limiting. Changes in detail or structure may be made without departing from the spirit of the invention as defined in the appended claims.

It must be noted that as used herein and in the appended claims, the singular forms "a", "an", and "the" include plural referents unless the context clearly dictates otherwise.

As will be apparent to those of skill in the art upon reading this disclosure, each of the individual embodiments described and illustrated herein has discrete components and features which may be readily separated from or combined with the features of any of the other several embodiments without departing from the scope or spirit of the present invention.

What is claimed is:

1. A system for processing substrates, comprising:
a loading chamber for introducing substrates from atmospheric environment into vacuum environment;
a loading arrangement for loading substrates onto substrate carriers inside the vacuum environment;
a heating chamber forming a static processing chamber for heating the substrate while the carrier is stationary;
a pass-by processing chamber attached to the heating chamber and having a transport section and a processing section, wherein the transport section is wider than width of the substrate, such that an entering carrier from the heating chamber can be accommodated within the pass-by processing chamber before a sputtering process is completed in the processing section on an entire surface of the prior substrate;
a transport mechanism configured to transport the carrier in the transport section at a transport speed until the carrier catches-up with another carrier that is already being processed in the processing section of the pass-by processing chamber, and to transport the carrier in the processing section at a pass-by speed, wherein the transport speed is faster than the pass-by speed;
a loading lifter arrangement configured to load substrates into the loading chamber;
an unloading lifter arrangement configured to remove substrates from the loading chamber;
wherein each of the loading lifter and unloading lifter arrangements comprises:
a retractable blade housing having a vacuum sealing plate at an upper end thereof;
a lifting blade movable inside the retractable blade housing; and,
a vertical motion mechanism coupled to the retractable blade housing and the lifting blade and vertically moving the retractable blade housing and the lifting blade.

2. The system of claim 1, wherein the transport mechanism comprises a plurality of wheels that are provided at the base of the static processing chamber and the pass-by processing chamber, and wherein selected wheels are energized independently.

3. The system of claim 1, wherein the transport section and the processing section are defined within a single un-partitioned enclosure.

4. The system of claim 1, further comprising a first translator configured for loading substrates onto substrate carriers and a second translator configured for removing substrates from the substrate carriers.

5. The system of claim 4, wherein the loading chamber comprises: a first loadlock arrangement configured for introducing substrates to the first translator, and a second loadlock arrangement configured for accepting substrates from the second translator.

6. The system of claim 5, wherein the loading lifter arrangement is configured for loading substrates onto the first loadlock arrangement, and the unload lifter arrangement is configured for removing substrates from the second loadlock arrangement.

7. The system of claim 6, wherein the first loadlock arrangement comprises two loadlock chambers and the second loadlock arrangement comprises two loadlock chambers.

8. The system of claim 7, wherein the loading lifter arrangement comprises two lifters and the unloading lifter arrangement comprises two lifters.

9. The system of claim 8, further comprising a first robot arm configured for loading substrates from cassettes and onto the loading lifter arrangement and a second robot arm configured for unloading substrates from the unloading lifter arrangement and onto cassettes.

10. The system of claim 9, wherein each of the first and second robot arms is retractable and rotatable.

11. A linear system for processing substrates in vacuum, comprising:
a first linear arrangement of chambers, the first linear arrangement maintaining vacuum environment and having passages enabling substrate carriers to move from one chamber directly to the next in a first traveling direction;
a second linear arrangement of chambers, the second linear arrangement maintaining vacuum environment and having passages enabling substrate carriers to move from one chamber directly to the next in a second traveling direction opposite the first traveling direction;
a loading chamber positioned at entry side of the first linear arrangement and configured to introduce substrates from atmospheric environment into the vacuum environment maintained by the first linear chamber arrangement;
an unloading chamber positioned at exit side of the second linear arrangement and configured to remove substrates from the vacuum environment maintained by the second linear chamber arrangement out to atmospheric environment;
a turning chamber connected to exit side of the first linear arrangement and to entry side of the second linear arrangement and configured to accept substrate carriers from the first linear arrangement and deliver the substrate carriers to the second linear arrangement;
a loading lifter configured to load substrates into the loading chamber;
an unloading lifter configured to remove substrates from the unloading chamber;
wherein each of the loading lifter and unloading lifter comprises:
a retractable blade housing having a vacuum sealing plate at an upper end thereof;
a lifting blade movable inside the retractable blade housing; and,
a vertical motion mechanism coupled to the retractable blade housing and the lifting blade and vertically moving the retractable blade housing and the lifting blade.

12. The system of claim 11, wherein each of the first linear arrangement and the second linear arrangement comprises at least one static processing chamber and at least one pass-by processing chamber, the pass-by processing chamber having a processing zone defined therein; and,
a substrate carrier transport mechanism configured to:
maintain the substrate carriers stationary during processing inside the static processing chamber;

move the substrate carriers at transport speed while the substrate carrier is moved inside the pass-by processing chamber, but outside the processing zone, until one carrier catches-up with another carrier that is already being processed in the processing section of the pass-by processing chamber; and, move the substrate carriers at pass-by speed while the substrate carrier is moved inside the pass-by processing chamber inside the processing zone, wherein the transport speed is faster than the pass-by speed.

13. The system of claim 11, wherein each of the loading lifter and unloading lifter comprises:

a first motor coupled to the retractable blade housing; and, a second motor coupled to the lifting blade.

14. The system of claim 13, further comprises:

loading robot arm configured to remove substrates from cassettes and deliver the substrates to the loading lifter; and, an unloading robot arm configured to remove substrates from the unloading lifter and deliver the substrates to the cassettes.

15. The system of claim 14, wherein each of the loading robot arm and unloading robot arm is rotatable about an axis and is configured to rotate substrates between horizontal orientation and vertical orientation.

\* \* \* \* \*